(12) United States Patent
Salzmann

(10) Patent No.: US 6,426,675 B1
(45) Date of Patent: Jul. 30, 2002

(54) METHOD AND ARRANGEMENT FOR CONTROLLING THE POWER OF A TRANSMISSION AMPLIFIER

(75) Inventor: Eugen Salzmann, Kranzberg (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/890,708

(22) PCT Filed: Feb. 1, 2000

(86) PCT No.: PCT/DE00/00303
§ 371 (c)(1),
(2), (4) Date: Aug. 3, 2001

(87) PCT Pub. No.: WO00/48311
PCT Pub. Date: Aug. 17, 2000

(30) Foreign Application Priority Data

Feb. 11, 1999 (DE) .......................... 199 05 730

(51) Int. Cl.[7] ................................. H03G 3/20
(52) U.S. Cl. ....................... 330/129; 330/140
(58) Field of Search ................ 330/129, 140; 455/126

(56) References Cited

U.S. PATENT DOCUMENTS

| 5,101,175 A | * | 3/1992 | Vaisanen | 330/131 |
| 5,126,686 A | | 6/1992 | Tam | 330/134 |
| 5,208,550 A | | 5/1993 | Iwane | 330/129 |
| 5,214,393 A | * | 5/1993 | Aihara | 330/129 |
| 5,369,789 A | * | 11/1994 | Kosugi et al. | 330/129 |
| 5,416,441 A | * | 5/1995 | Nagano | 330/129 |
| 5,423,081 A | | 6/1995 | Thiele et al. | 455/116 |
| 5,852,770 A | * | 12/1998 | Kasamatsu | 330/129 |

FOREIGN PATENT DOCUMENTS

| EP | 0 412 392 A2 | 2/1991 |
| EP | 0 472 330 A2 | 2/1992 |
| EP | 0 509 733 A2 | 10/1992 |
| EP | 0 546 693 A1 | 6/1993 |

* cited by examiner

Primary Examiner—Robert Pascal
Assistant Examiner—Khanh Van Nguyen
(74) Attorney, Agent, or Firm—Bell, Boyd & Lloyd LLC

(57) ABSTRACT

A method and arrangement for controlling the power of a transmission amplifier reliably within as wide a power band as possible, for a desired transmission power level which is less than a predetermined limit value. In the present invention, a portion of the power emitted from the transmission amplifier is output through a switching device in addition to the power which is output through a directional coupler, and is used to control the transmission amplifier.

4 Claims, 3 Drawing Sheets

METHOD AND ARRANGEMENT FOR CONTROLLING THE POWER OF A TRANSMISSION AMPLIFIER

BACKGROUND OF THE INVENTION

Field of the Invention

The invention relates to a method and an arrangement for controlling the power of a transmission amplifier, in particular of a transmission amplifier in a mobile radio terminal.

FIG. 3 shows an outline circuit diagram of a conventional arrangement for controlling the power of a transmission amplifier PA. The signals sig which are supplied to the transmission amplifier PA and are to be amplified are amplified on the basis of a control parameter reg, which is supplied to the transmission amplifier PA and represents a measure of the gain or the gain level/factor, and are supplied to a directional coupler RK. The directional coupler RK outputs a small portion of the power supplied from the transmission amplifier PA to the antenna ANT and supplies it to a radio frequency detector HFD, which converts this power into a DC voltage. This DC voltage value produced in this way is supplied as an actual value—(act)—to a comparison device V, where it is compared with a nominal value—(nom)—which is predetermined by a control device, such as a microcontroller in a mobile radio terminal. The comparison results in a control parameter reg being output, which sets the gain of the transmission amplifier PA such that the actual value corresponds to the nominal value nom. To this end, the gain factor is raised or lowered based on the difference between the nominal value and the actual value. The majority of the power is supplied from the directional coupler RK to the antenna ANT, from which this power is transmitted in the form of radio-frequency signals. Such conventional power control loops for a transmission amplifier operate well over a narrow predetermined power band.

However, in order to improve the spectrum utilization and to increase the operating time of the mobile radio appliance, modern mobile radio terminals can be operated at different transmission power levels. For example, depending on the power class of the mobile radio terminal, the transmission power of GSM (Global System for Mobile Communication) mobile radio terminals can be varied within a range of 20 and 30 dB. Furthermore, the transmission power of mobile radio terminals which operate using a time slot mode, such as GSM mobile radio terminals, must be controlled on the basis of a predetermined time slot structure. In this case, it is particularly important in order to produce a transmission pulse (burst) to set the transmission amplifier in accordance with a fixed predetermined nominal time/power curve (power ramping), which likewise necessitates a wide power dynamic range.

These two requirements for controlling the power of a transmission amplifier can no longer be satisfied reliably by conventional methods or arrangements. In particular, reliable power detection by means of an RF detector over a wide power band is scarcely feasible using simple means. This problem is further exacerbated when controlling the power of a multiband or multimode mobile radio terminal since, in this case, the number of transmission power levels is further increased, and different nominal time/power curves can be specified. Future CDMA mobile radio terminals will also require transmission power control over a very wide power band.

SUMMARY OF THE INVENTION

The invention is thus based on the object of specifying a method and arrangement for controlling the power of a transmission amplifier, which allow the power to be controlled in a simple manner and nevertheless reliably over a wide power band. According to the invention, a portion of the power emitted from a transmission amplifier is output by means of a coupling element, and for a desired transmission power level, which is less than a predetermined limit value, a further portion of the power is additionally output by means of a controlled switching device, and the output power is used for controlling the transmission amplifier.

The invention is accordingly based on the idea of outputting a relatively small portion of the power by means of a coupling element in a first case in which the desired transmission power is greater than a predetermined limit value, and of using this small portion to control the power of the transmission amplifier. In a second case, in which the desired transmission power is below a specific limit value, a relatively large portion of the power emitted from the transmission amplifier is additionally output via a switching device, and is used to control the power of the transmission amplifier.

This means that, in both cases, the absolute value of the output power is at least in a similar order of magnitude, and the components which are used for further processing the output power to form a control parameter for the transmission amplifier, in particular the radio-frequency detector, can thus be operated in a relatively narrow band, thus ensuring that the power can be controlled more reliably and with less complexity.

DETAILED DESCRIPTION OF THE PREFERRED EMBODIMENT

Figure 1:
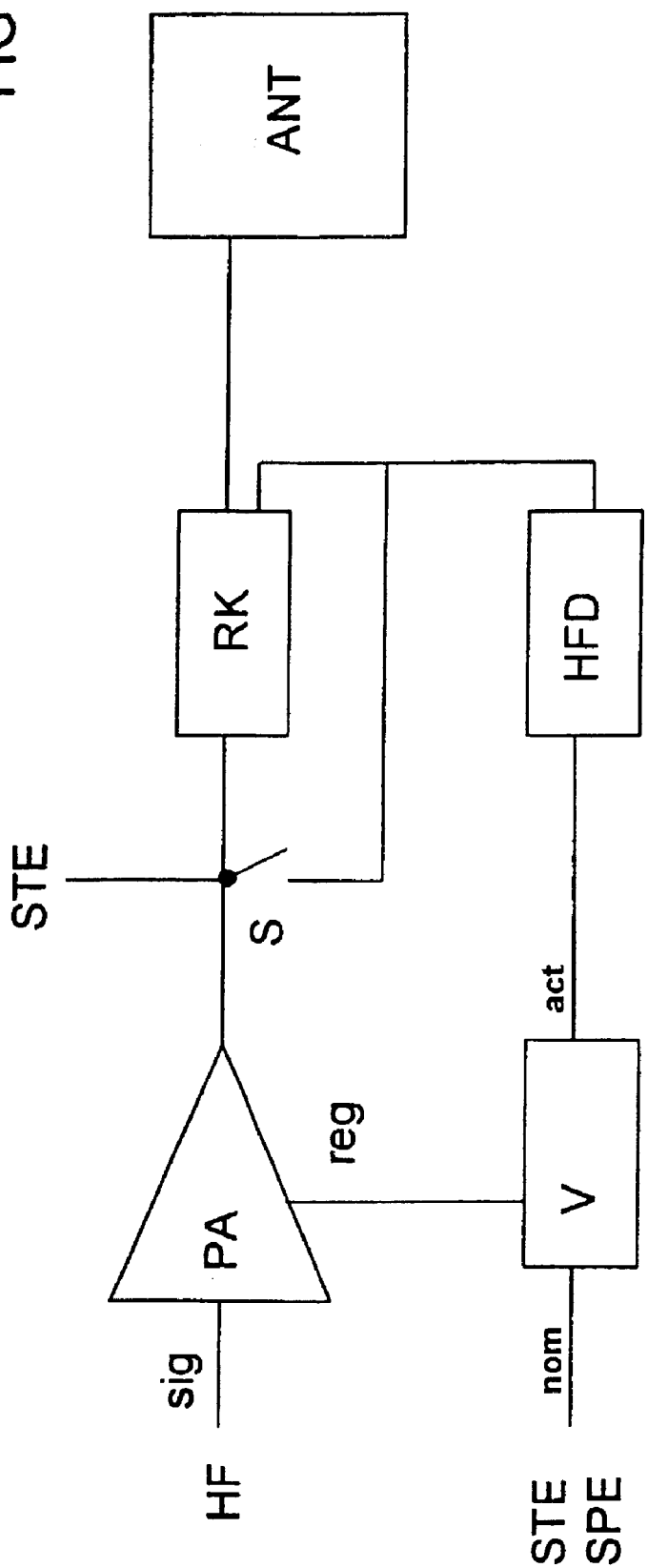
FIG. 1 shows an outline circuit diagram of one embodiment of an arrangement for controlling the power of a transmission amplifier.

FIG. 1 shows a transmission amplifier PA which amplifies the signals sig, which, for example, are output from the radio-frequency section HF of a mobile radio terminal, based on a control parameter reg which is likewise supplied to the transmission amplifier PA, and which outputs a power level corresponding to this control parameter reg.

In a first case, in which the desired transmission power, for example the desired power step or the maximum power which can be emitted from the transmission amplifier or from the antenna during operation of the mobile radio terminal in this power step, is greater than a predetermined limit value, the switching device S, which is controlled by a control device STE (such as the microcontroller in a mobile radio terminal) and may be, for example, in the form of a transistor, is opened, so that only a relatively small portion of the power emitted from the transmission amplifier PA is output through a coupling element, such as a directional coupler RK, and is supplied to a power detector, such as a radio-frequency detector HFD. The radio-frequency detector may also be in the form of a diode or a transistor. The other relatively large portion of the power is supplied to an antenna ANT, from which it is transmitted. The radio-frequency detector HFD converts the output power to a DC voltage signal which is supplied as an actual value to a comparison device V, which may be in the form of a differential amplifier circuit. This actual value is compared there with a nominal value nom, with a control parameter reg being output as the result of the comparison, which is set in such a manner that the signals emitted from the transmission amplifier are at a power level which corresponds to the desired transmission power; this is the situation when the nominal value nom corresponds to the actual value act.

The nominal value nom in this case corresponds to the currently desired power value on a nominal time/power curve, which can be stored in a memory device SPE, for example a read only memory, and can be selected, read, and, if necessary, adapted or processed by the control device STE, for example a microcontroller in a mobile radio terminal. The corresponding value is then supplied as the nominal value nom to the comparison device V.

In a second case, in which the desired transmission power level is less than a predetermined limit value, the controlled switching device S is closed and a relatively large portion of the power emitted from the transmission amplifier PA is output through the switching device S. This output power is supplied to the radio-frequency detector HFD together with the relatively small, possibly negligible, proportion of the power which is output through the directional coupler RK and, after conversion to a DC voltage, is supplied as the actual value act to the comparison device V.

When the switching device S is closed, a considerably greater absolute value of the power is output for power control, and can thus not be supplied to the antenna. In order to continue to supply the desired transmission power level to the antenna, the gain through the transmission amplifier is correspondingly increased. For this purpose, the switch position of the switching device S can also be taken into account as follows: the nominal value nom is either determined on the basis of different nominal time/power curves read from the memory device SPE, or on the basis of a standard nominal time/power curve which, once the corresponding values have been read, can be further processed and adapted by the control device STE depending on the switch position.

When the invention is used in a multimode or multiband terminal, the power control adaptation to the present power step or the present nominal time/power curve can likewise be carried out by selection of the corresponding nominal time/power curve or by adaptation of a standard nominal time/power curve by means of the control device.

In order to illustrate the exemplary embodiments clearly, the drawings do not show duplexers, diplexers, matching or converter circuits.

Figure 2:
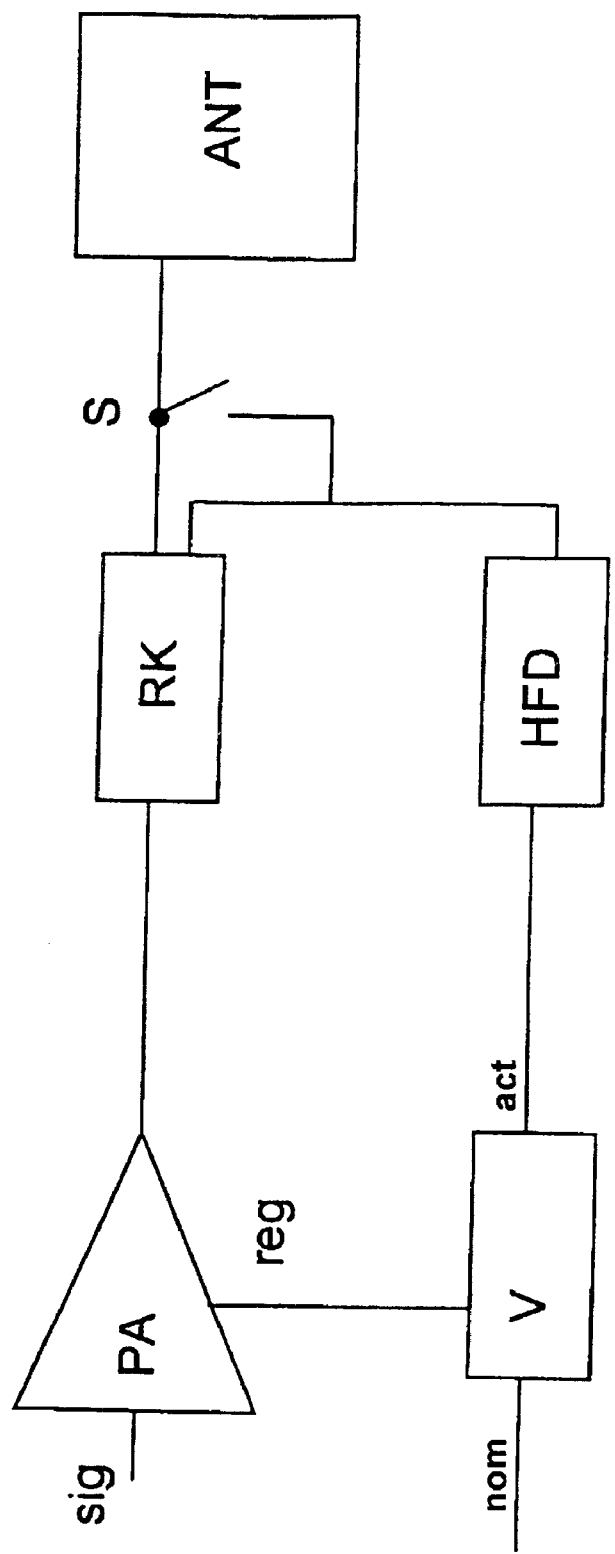
FIG. 2 shows an outline circuit diagram of one embodiment of an arrangement for controlling the power of a transmission amplifier.
Figure 3:
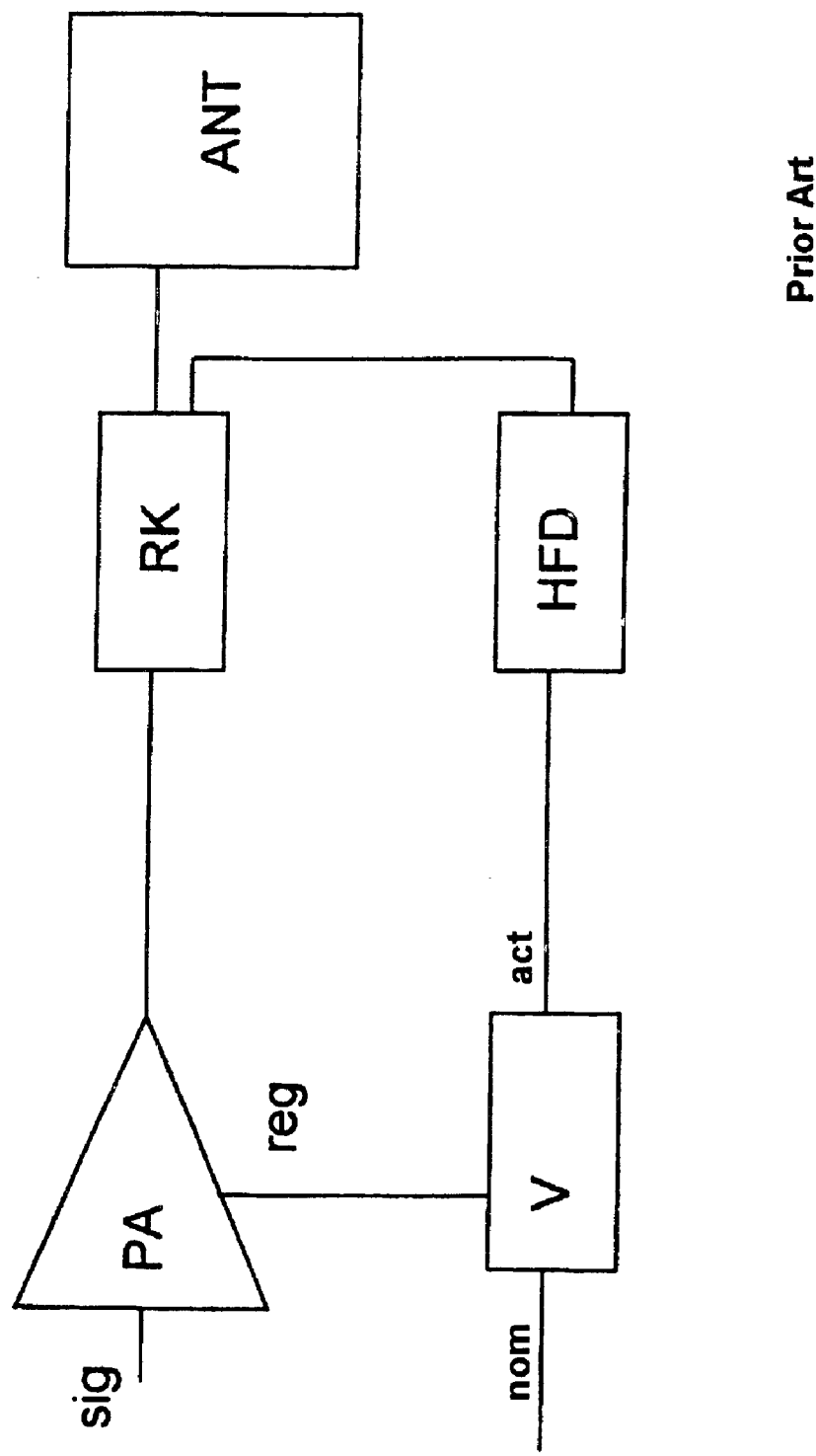
FIG. 3 shows an outline circuit diagram of a conventional arrangement for controlling the power of a transmission amplifier.

FIG. 2 shows one design variant of the invention, which differs essentially from the exemplary embodiment illustrated in FIG. 1 in that the controlled switching device S is not arranged between the transmission amplifier PA and the coupling element RK, but between the coupling element RK and the antenna ANT. In this case, the two design variants operate essentially in the same way.

Although other modifications and changes may be suggested by those skilled in the art, it is the intention of the inventors to embody within the patent warranted hereon all changes and modifications as reasonably and properly come within the scope of their contribution to the art.

What is claimed is:

1. A method for controlling power of a transmission amplifier, comprising the steps of:

outputting a first portion of a power being emitted from a transmission amplifier via a directional coupler before the power is supplied to an antenna;

further outputting a second portion of the power being emitted from the transmission amplifier via a control switching device, provided that a desired transmission power level for the transmission amplifier is less than a predetermined value, an input for said control switching device being located between the directional coupler and one of the transmission amplifier and the antenna, an output for said control switching device being located between the directional coupler and a device for controlling the power of the transmission amplifier, said further outputting step for obtaining a desired transmission power level; and setting a gain factor of the transmission amplifier by utilizing a signal that is dependant on a total output power of the transmission amplifier.

2. A method according to claim 1, further comprising the steps of:

supplying the signal to a comparison device, said signal corresponding to an actual value;

further supplying a nominal value to the comparison device, said nominal value corresponding to a nominal power level, said nominal value being determined as a function of a position of the control switching device;

comparing the actual value with the nominal value via the comparing device; and setting the gain factor of the transmission amplifier based on a result of said comparing step.

3. An arrangement for controlling the power of a transmission amplifier comprising:

a transmission amplifier;

a device for controlling the power of the transmission amplifier;

a directional coupler for outputting a portion of a power emitted from the transmission amplifier before said power is being supplied to an antenna; and a control switching device for further outputting a further portion of the power emitted from the transmission amplifier, provided that a desired transmission power for the transmission amplifier is being less than a predetermined limit value, said control switching device having an input located between the directional coupler and one of the transmission amplifier and the antenna, an output of said control switching device being located between the directional coupler and the device for controlling the power of the transmission amplifier.

4. An arrangement according to claim 3, further comprising;

a comparison device for comparing a nominal value with an actual value and for outputting a comparison result, said comparison device being supplied with a signal corresponding to the actual value, said signal being dependent on a total output power of the transmission amplifier, said comparison device being further supplied with a nominal value, said nominal value corresponding to a nominal power level; and a device for determining the nominal value as a function of a position of the control switching device.

* * * * *